(12) United States Patent
Kawabata et al.

(10) Patent No.: US 8,163,647 B2
(45) Date of Patent: Apr. 24, 2012

(54) METHOD FOR GROWING CARBON NANOTUBES, AND ELECTRONIC DEVICE HAVING STRUCTURE OF OHMIC CONNECTION TO CARBON ELEMENT CYLINDRICAL STRUCTURE BODY AND PRODUCTION METHOD THEREOF

(75) Inventors: Akio Kawabata, Kawasaki (JP); Mizuhisa Nihei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 191 days.

(21) Appl. No.: 12/458,308

(22) Filed: Jul. 8, 2009

(65) Prior Publication Data
US 2009/0269921 A1    Oct. 29, 2009

Related U.S. Application Data

(62) Division of application No. 10/773,311, filed on Feb. 9, 2004, now abandoned.

(30) Foreign Application Priority Data

Mar. 20, 2003   (JP) ................................ 2003-078353
Mar. 25, 2003   (JP) ................................ 2003-083192

(51) Int. Cl.
*B32B 9/00*       (2006.01)
*B32B 15/04*      (2006.01)

(52) U.S. Cl. ...................................... 438/652; 438/778

(58) Field of Classification Search ........................ None
See application file for complete search history.

(56) References Cited

U.S. PATENT DOCUMENTS

| | | | |
|---|---|---|---|
| 6,787,122 B2 * | 9/2004 | Zhou .......................... | 423/447.1 |
| 7,084,507 B2 | 8/2006 | Awano ........................ | 257/773 |
| 2002/0163079 A1 * | 11/2002 | Awano ........................ | 257/750 |
| 2002/0167375 A1 | 11/2002 | Hoppe et al. .................. | 333/186 |

FOREIGN PATENT DOCUMENTS

| | | |
|---|---|---|
| JP | 09031757 A | 2/1997 |
| JP | 10203810 A | 8/1998 |
| JP | 11116218 A | 4/1999 |
| JP | 11139815 A | 5/1999 |
| JP | 2000353467 A | 12/2000 |
| JP | 2001020072 A | 1/2001 |
| JP | 2001303250 A | 10/2001 |

(Continued)

OTHER PUBLICATIONS

Choi et al; "Variations in structure and emission characteristics of nanostructured carbon films prepared by the hot-filament chemical-vapor-deposition method due to the addition of ammonia in the source;" J. Vac. Sci. Technol. B 21(1) (Jan./Feb. 2003) pp. 576-580.

(Continued)

*Primary Examiner* — Zandra Smith
*Assistant Examiner* — Pamela E Perkins
(74) *Attorney, Agent, or Firm* — Kratz, Quintos & Hanson, LLP

(57) ABSTRACT

An electronic device having a structure of an ohmic connection to a carbon element cylindrical structure body, wherein a metal material is positioned inside the junction part of a carbon element cylindrical structure body joined to a connection objective and the carbon element cylindrical structure body and the connection objective are connected by an ohmic contact. Methods for producing such an electronic device are also disclosed. Further, a method for growing a carbon nanotube is disclosed.

9 Claims, 10 Drawing Sheets

FOREIGN PATENT DOCUMENTS

| | | |
|---|---|---|
| JP | 2001-358083 | 12/2001 |
| JP | 2002-110567 | 4/2002 |
| JP | 2002179418 A | 6/2002 |
| JP | 2002518280 A | 6/2002 |
| JP | 2002-212729 | 7/2002 |
| JP | 2002530805 | 9/2002 |
| JP | 2002293524 A | 10/2002 |
| JP | 2004-238258 | 8/2004 |
| WO | WO 99/65821 | 12/1999 |
| WO | WO 00/30141 | 5/2000 |

OTHER PUBLICATIONS

Bonnot et al; "Carbon nanostructures and diamond growth by HFCVD: role of the substrate preparation and synthesis conditions;" Diamond and Related Materials 8 (1999);pp. 631-635.

Chen et al; "Hot Filament for In Situ Catalyst Supply in the Chemical Vapor Deposition Growth of Carbon Nanotubes;" Jpn. J. Appl. Phys. vol. 41 (2002) pp. L67-L69.

Lee et al; "Effects of metal buffer layers on the hot filament chemical vapor deposition of nanostructured carbon films;" J. Vac. Sci. Technol. B21(1) (Jan./Feb. 2003) pp. 623-626.

Cheung et al; "Diameter-Controlled Synthesis of Carbon Nanotubes;" J. Phys. Chem. B 106 (2002) pp. 2429-2433.

Li et al; "Growth of Single-Walled Carbon Nanotubes from Discrete Catalytic Nanoparticles of Various Sizes;" J. Phys. Chem. B, 105 (2001) pp. 11424-11431.

Japanese Office Action dated Feb. 19, 2007.

Maruyama et al; "Low temperature synthesis of high-purity single-walled carbon nanotubes from alcohol" Chemical Physics Letter (Jul. 10, 2002); Elsevier Science 360 (2002) pp. 229-234 (also see spec p. 3).

"Organized assembly of carbon nanotubes"; NATURE; vol. 416; Apr. 4, 2002; pp. 495-496 (also see spec p. 3).

Tang et al; "Carbon monoxide-assisted growth of carbon nanotubes"; Chemical Physics Letter (Jul. 13, 2001); Elsevier Science 342 (2001); pp. 259-264.

Zhang et al; "Heterostructures of Single-Walled Carbon Nanotubes and Carbide Nanorods"; Science vol. 285 (Sep. 10, 1999); pp. 1719-1722.

* cited by examiner

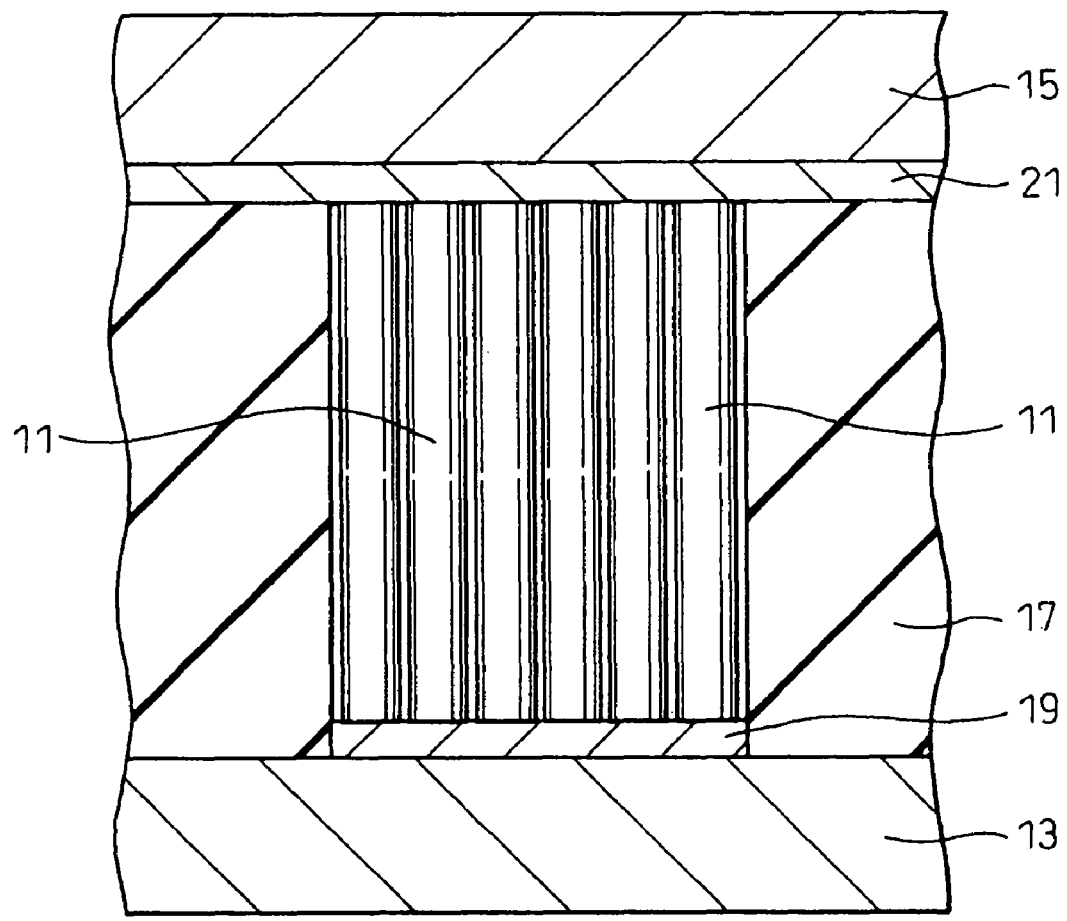

METHOD FOR GROWING CARBON NANOTUBES, AND ELECTRONIC DEVICE HAVING STRUCTURE OF OHMIC CONNECTION TO CARBON ELEMENT CYLINDRICAL STRUCTURE BODY AND PRODUCTION METHOD THEREOF

CROSS-REFERENCES TO RELATED APPLICATIONS

This application is a Divisional Application of prior application Ser. No. 10/773,311, filed on Feb. 9, 2004, now abandoned which is being hereby incorporated by reference.

This application is based upon and claims the benefit of priority from each of prior Japanese Patent Applications No. 2003-078353, filed on Mar. 20, 2003, and No. 2003-083192, filed on Mar. 25, 2003, the entire contents thereof being incorporated herein by reference.

BACKGROUND OF THE INVENTION

1. Field of the Invention

The present invention relates to an electronic device having a structure for ohmic connection to a carbon element cylindrical structure body represented by a carbon nanotube and a production method thereof, which techniques are widely applicable when a carbon element cylindrical structure body is applied to an electronic device.

The present invention also relates to a method for growing carbon nanotubes.

2. Description of the Related Art

In recent years, studies are being made on the use of a carbon element cylindrical structure body as an electrically conducting or semiconductor material in an electronic device. In the electronic device, a carbon element cylindrical structure body must be ohmically connected to an electrode or a wire so as to avoid an increase in electric resistance in the connection part.

FIG. 1 schematically shows the connection of a carbon element cylindrical structure body 11, which is formed as a longitudinal via material in a via hole of an electronic device, to a lower wiring Cu layer 13 and an upper wiring Cu layer 15. In a via hole formed in an interlayer insulating film 17 on the lower wiring layer 13, a bundle of carbon element cylindrical structure bodies 11 is formed in vertical orientation. The carbon element cylindrical structure body 11 is grown by using a chemical vapor deposition (CVD) method and, at this time, a catalyst metal (for example, Ni) layer 19, necessary for the growth of the carbon element cylindrical structure body, is present on the wiring layer exposed in the via hole. On the other hand, between the carbon element cylindrical structure body 11 and the upper wiring layer 15, a Ti layer 21 is inserted.

The connection between the carbon element cylindrical structure body 11 and the upper wiring layer 15 is an ohmic connection resulting from carbidization (formation into TiC) of the Ti layer 21 intervening therebetween. This method is a technique of contacting the carbon element cylindrical structure body with the Ti layer and then performing a heat treatment at a high temperature to cause TiC formation at the interface, thereby obtaining an ohmic connection (see, Y. Zhang et al., *Science* 285, 1719 (1999)).

As shown in FIG. 1, in the conventional structure, only a catalyst metal (Ni) layer 19, necessary for the growth of the carbon element cylindrical structure body 11, is present on the lower wiring (Cu) layer 13.

With respect to the production method of a carbon nanotube, arc discharge, laser evaporation, thermal CVD, plasma enhanced CVD and the like are known. By the arc discharge or laser evaporation method, a carbon nanotube having good quality can be obtained but the orientation or length of carbon nanotubes can hardly be controlled.

The method of enabling the control of the orientation or direction includes a thermal CVD method and a plasma enhanced CVD method. In these methods, carbon nanotubes can be orientation-grown by applying an electric field during the growth. The orientation growth in the case of not applying an electric field is described in *Nature*, Vol. 416, pp. 495-496 (2002), however, the growth temperature is as high as 800° C. or more and therefore, it is impossible to grow carbon nanotubes on a semiconductor circuit by this technique. Furthermore, the growth of carbon nanotubes at 550° C. is reported in *Chemical Physics Letters*, 360, pp. 2229-234 (2002), however, the growth direction cannot be controlled.

Various methods for producing carbon nanotubes by using thermal CVD are described in patent documents. For example, Japanese Unexamined Patent Publication (Kokai) No. 9-31757 (JP 9-31757 A) discloses a method of producing graphite nanotubes at a low temperature by CVD, where the graphite nanotube is produced at 650 to 800° C. Japanese Unexamined Patent Publication (Kokai) No. 10-203810 (JP 10-203810 A) describes a technique of growing carbon nanotubes on a substrate at a relatively low temperature, where the growth requires a plasma produced by a direct-current glow discharge. Japanese Unexamined Patent Publication (Kokai) No. 11-139815 (JP 11-139815 A) describes a method for producing a carbon nanotube device by using a thermal decomposition reaction of the starting material gas. Also, Japanese Unexamined Patent Publication (Kokai) No. 2001-303250 (JP 2001-303250 A) describes a method of vertically orienting carbon nanotubes on a substrate by using thermal CVD, where a direct current voltage is applied during the growth.

In these methods for producing carbon nanotubes by using thermal CVD, when auxiliary means such as an electric field is not used, a growth temperature of 500° C. or more is generally used.

A CVD method using a hot filament (hot-filament CVD) is also known. Japanese Unexamined Patent Publication (Kokai) No. 2000-353467 (JP 2000-353467 A) describes a method for producing a cold cathode device, where a diamond or diamond-like carbon electron-releasing material is formed by hot-filament CVD. The production of carbon nanotubes is not referred to therein. Japanese National Publication (Kohyo) No. 2002-518280 (JP 2002-518280 A) describes a method for growing carbon nanotubes by hot-filament CVD. In this method, an electric field is applied during the growth.

In this way, in conventional production of carbon nanotubes by hot-filament CVD, application of an electric field is performed as auxiliary means.

Also, a technique of growing carbon nanotubes at a filament temperature of 1,600° C. by hot-filament CVD is described in *Chemical Physics Letters*, 342, pp. 259-264 (2001).

SUMMARY OF THE INVENTION

The electronic device having a structure of an ohmic connection to a carbon element cylindrical structure body according to the present invention is characterized in that a metal material is positioned inside the junction part of a carbon element cylindrical structure body joined to a connection objective and the carbon element cylindrical structure body and the connection objective are connected by an ohmic contact. By virtue of connection through an ohmic contact, the increase in resistance at the connected part between the carbon element cylindrical structure body and the connection objective can be suppressed.

The electronic device having a structure of an ohmic connection to a carbon element cylindrical structure body of the present invention can be produced by a method comprising disposing a metal material on a connection objective capable of ohmically contacting with a carbon element cylindrical structure body, and forming a carbon element cylindrical structure body according to chemical vapor deposition using the metal material as the catalyst while accomplishing an ohmic contact between the carbon element cylindrical structure body and the connection objective. By using for the connection objective a material capable of ohmically contacting with a carbon element cylindrical structure body, an ohmic connection structure therebetween can be realized simultaneously with the growth of the carbon element cylindrical structure body.

Alternatively, the electronic device having a structure of an ohmic connection to a carbon element cylindrical structure body of the present invention can be produced by a method comprising forming a first stack of a first material capable of ohmically contacting with a carbon element cylindrical structure body and a second material of catalyst metal disposed on the first material, heat-treating the first stack in vacuum or in a hydrogen atmosphere to form a second stack made of a lower layer composed of an alloy of the first material and the second material, an intermediate layer composed of the first material and an upper layer composed of a fine particle formed of the second material, and forming a carbon element cylindrical structure body by chemical vapor deposition using the fine particle of the second material on the surface of the second stack as the catalyst to incorporate the fine particle of the second material into the inside of the carbon element cylindrical structure body and at the same time, connect, by an ohmic contact, the side wall of the carbon element cylindrical structure body to the intermediate layer composed of the first material. The carbon element cylindrical structure body grows on the first material capable of an ohmic contact by the action of the fine particle catalyst, so that the carbon element cylindrical structure body can be connected by an ohmic contact to the intermediate layer composed of the first material simultaneously with the growth of the carbon element cylindrical structure body.

The term "carbon element cylindrical structure body" as used herein is a linear nanostructure constituted by carbon atoms and this is a generic term for a carbon nanotube, a cup-stacked type structure, a carbon fiber or the like.

The method for growing a carbon nanotube of the present invention is a method comprising disposing a substrate in a growth chamber, supplying a starting material gas to the chamber and orientation-growing a carbon nanotube on the substrate by CVD, the method being characterized in that neither an electric field nor a plasma is used for the growth of the carbon nanotube and that heat generated from a filament disposed in the growth chamber is utilized.

By using the hot filament, carbon nanotubes can be orientation-grown at a relatively low temperature, specifically, even at a substrate growth face temperature of less than 500° C.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein:

FIG. 1 is a schematic view for explaining a conventional technique of using a carbon element cylindrical structure body for the longitudinal via material of an electronic device;

DETAILED DESCRIPTION OF THE INVENTION

As described above, the term "carbon element cylindrical structure body" as used herein is a linear nanostructure constituted by carbon atoms and this is a generic term for a carbon nanotube, a cup-stacked type structure, a carbon fiber or the like. In the following, the present invention is described by referring to carbon nanotube which is one representative of these nanostructures.

In a conventional structure, such as that shown in FIG. 1, a Ti layer is not present between the carbon element cylindrical structure body 11 and the lower wiring layer 13 and therefore, an ohmic contact by the TiC formation cannot be formed. Furthermore, as for the contact with the lower wiring layer 13, an ohmic contact cannot be formed as in the case of the upper wiring layer 15 by depositing a Ti layer after the growth of the carbon element cylindrical structure body 11 and, subsequently, performing a high-temperature heat treatment. That is, in the conventional structure, an ohmic contact ensuring sufficiently low resistance cannot be formed between the lower wiring layer and the carbon element cylindrical structure body and, thus, the wiring/via part formed by the carbon element cylindrical structure body disadvantageously has high resistance.

One of objects of a first aspect of the present invention is to provide an electronic device having a structure of an ohmic connection to a carbon element cylindrical structure body, which can be realized simultaneously with the growth of the carbon element cylindrical structure body, and a production method thereof.

Figure 2A:
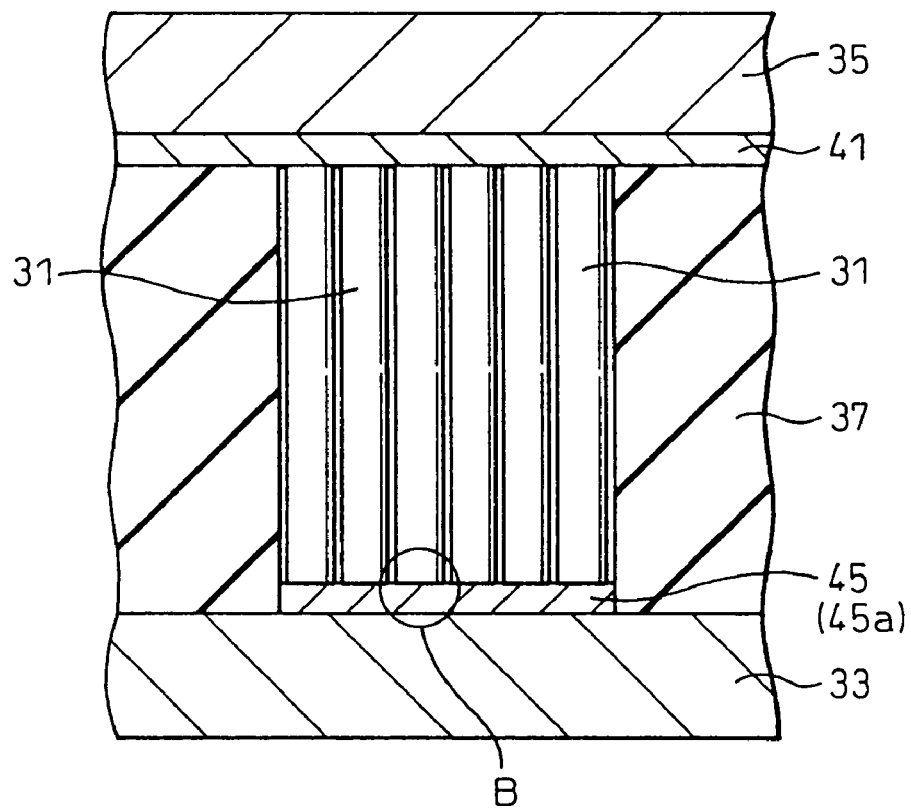
FIG. 2A is a schematic view for explaining a first embodiment of the present invention, where a carbon element cylindrical structure body is applied to the longitudinal via of an electronic device.
Figure 2B:
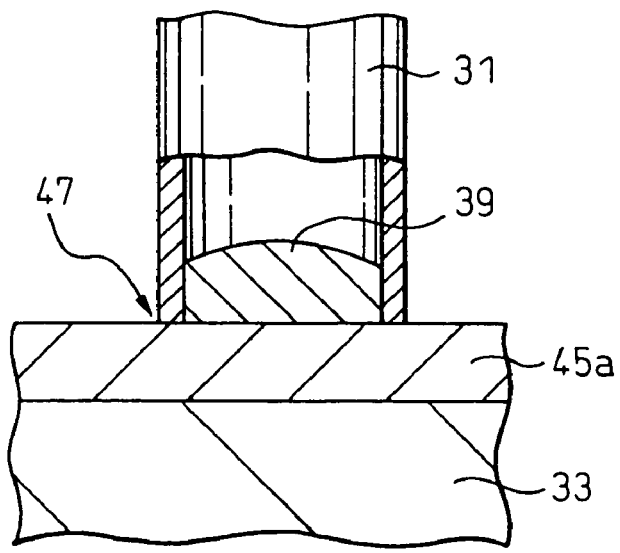
FIG. 2B is an enlarged view of the portion denoted by B in FIG. 2A.
Figure 3A:
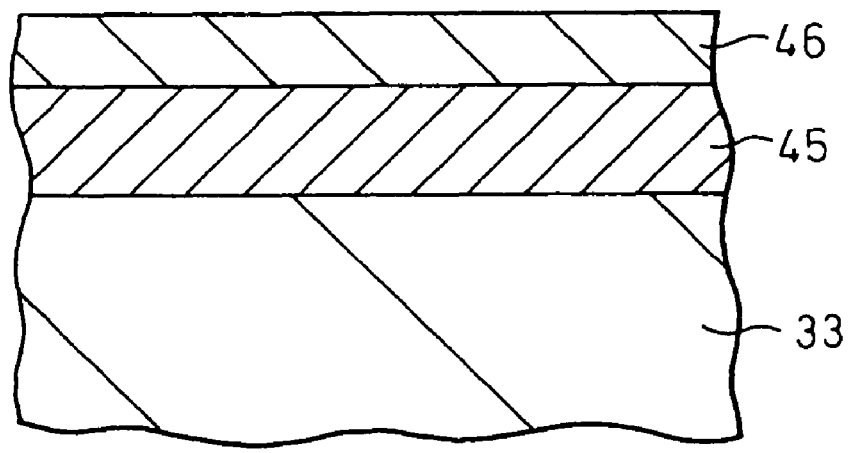
FIG. 3A is a view for explaining a laminate film used in the method for producing a structure of an ohmic connection of the present invention.
Figure 3B:
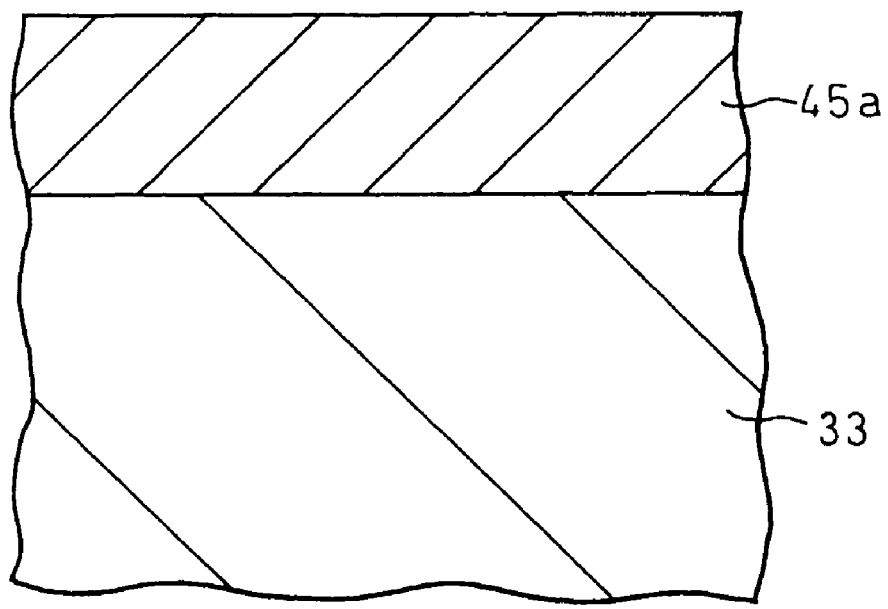
FIG. 3B is a view for explaining a NiTi alloy layer obtained from the Ni/Ti laminate film of FIG. 3A.

FIGS. 2A and 2B schematically show an embodiment in which the present invention is applied to an electronic device having a longitudinal via. Within a via hole formed in an interlayer insulating film 37 on a lower wiring (Cu) layer 33, a bundle of carbon nanotubes 31 is formed in vertical orientation. In the present invention, as shown in FIG. 3A, a laminate film obtained by previously forming, on the lower wiring layer 33 in the via hole, a Ti layer 45 for the TiC formation of the junction part of the carbon nanotube 31 to the lower wiring layer 33 and forming thereon a catalyst metal (for example, Ni) layer necessary for the growth of nanotubes is used. When this Ni/Ti laminate film is used, the Ni/Ti laminate film is subject to an elevation of the substrate temperature at the time of growing carbon nanotubes by chemical vapor deposition and changes into a NiTi alloy layer 45a (FIG. 3B). The carbon nanotube 31 grows on the surface of the NiTi alloy layer 45a by using, as a nucleus, the catalyst metal Ni fine particle in the alloy. As shown in FIG. 2B, which is an enlarged view of the portion denoted by B in FIG. 2A, the Ni fine particle 39 is embraced in the inside at the root of the growing carbon nanotube 31 and the side wall of the nanotube 31 comes into contact with Ti remaining on the surface of the alloy layer 45a. This contact portion 47 becomes the ohmic contact site where Ti is carbidized. In other words, an ohmic contact can be formed between the alloy layer 45a and the nanotube 31 simultaneously with the growth of carbon nanotube.

In fact, when the contact resistance between the nanotube 11 or 31 and the lower wiring layer 13 or 33 was measured for the structures of conventional example (FIG. 1) and the present invention (FIG. 2), the resistance of the present invention was lower by single or double figures (conventional example: 15 MΩ, present invention: 130 kΩ). This result infers that when the present invention is used, TiC formation occurs at the contact portion between the carbon nanotube and the lower wiring layer simultaneously with the growth of carbon nanotube.

The carbon nanotube 31 formed within the via hole and the upper wiring layer 35 can be ohmically connected, as in the conventional art, by the carbidization (TiC formation) of the Ti layer 41 intervening therebetween. In this way, according to the present invention, the carbon nanotube can be connected by a good ohmic contact with both the lower and upper wiring layers 33 and 35 and a via with low resistance can be realized.

In the case described above (first embodiment), the connection objective to which the carbon nanotube 31 is ohmically connected is an alloy layer 45a and the metal material thereon is a catalyst metal fine particle 39.

Figure 4A:
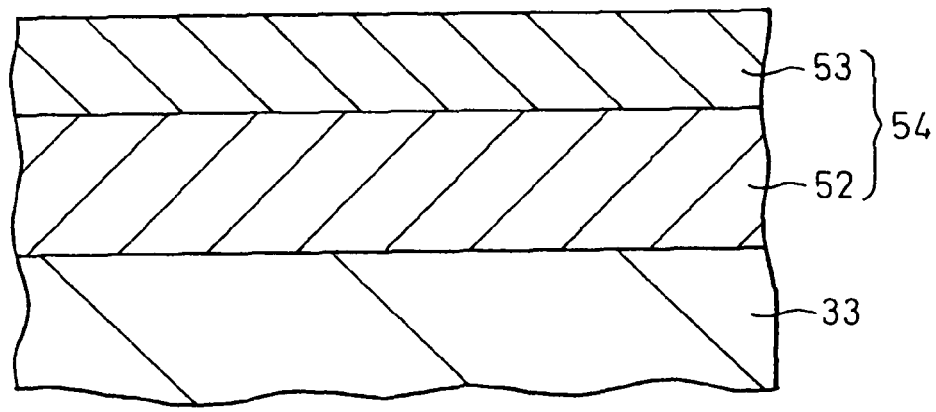
FIG. 4A is a schematic partial enlarged view for explaining the first stack used in a second embodiment of the present invention.
Figure 4B:
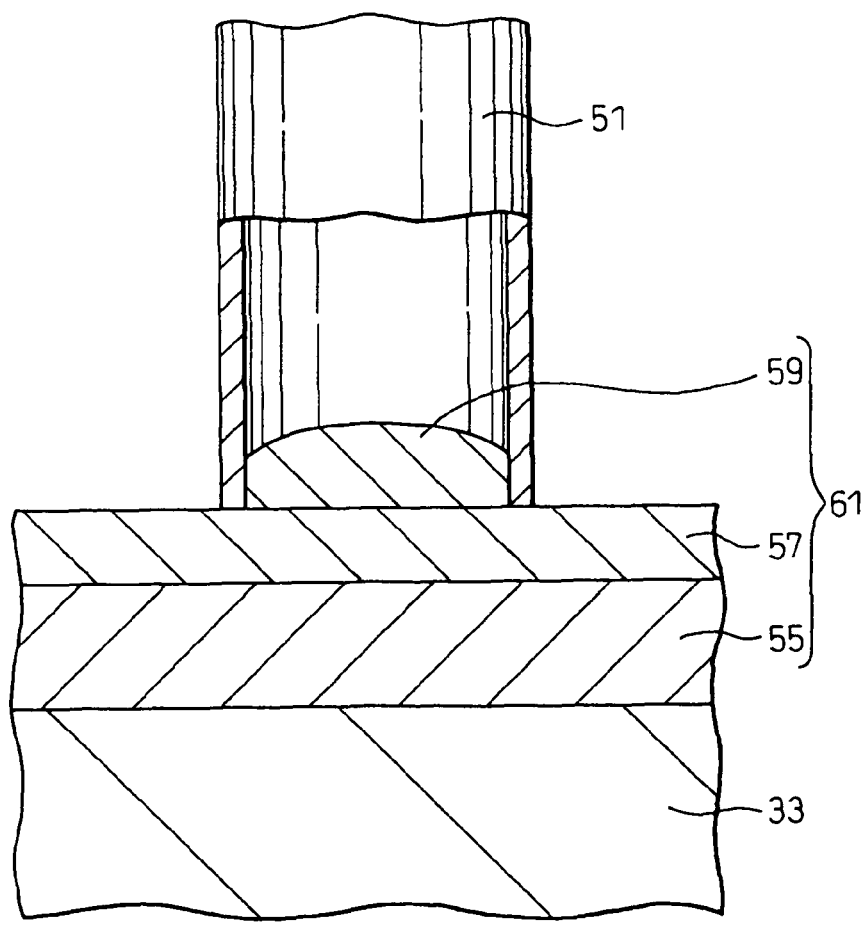
FIG. 4B is a schematic partial enlarged view for explaining the second stack used in the second embodiment of the present invention.

A second embodiment where the present invention is applied to an electronic device having a longitudinal via is described below. Similarly to the first embodiment described by referring to FIGS. 2A and 2B, as shown in FIG. 4A, a first stack 54 made of a Ti layer 52 for the TiC formation of the junction part of the carbon nanotube to the lower wiring layer 33 and a catalyst metal Ni layer 53 provided thereon is formed on the lower wiring layer 33 within a via hole. This stack is heat-treated in a vacuum or in a hydrogen atmosphere to form a second stack 61 constituted by, as shown in FIG. 4B which is a partial enlarged view similarly to FIG. 2B, a lower layer 55 of TiNi alloy, an intermediate layer 57 of Ti and an upper layer of Ni fine particle 59. Subsequently, chemical vapor deposition is performed by using the Ni fine particle on the surface of the stack 61 as the catalyst, whereby the Ni fine particle is incorporated inside the carbon nanotube 51 and, at the same time, a part of Ti in the intermediate layer 57 contacting with the bottom of the side wall of carbon nanotube 51 is carbidized to join the carbon nanotube 51 and the Ti intermediate layer 57 by ohmic contact.

In this embodiment, the Ti layer 57 corresponds to the connection objective to which the carbon nanotube is ohmically connected in the first embodiment, and the Ni fine particle 59 similarly corresponds to the metal material as the catalyst fine particle in the previous case.

The connection objective to which the carbon element cylindrical structure body is connected by an ohmic contact is the NiTi alloy layer 45a in the first embodiment and this layer is derived from the Ti layer 45 which is previously formed. In the second embodiment, the connection objective is the Ti intermediate layer 57 and this layer is also derived from the Ti layer which is previously formed (Ti layer before heat treatment). In this meaning, in either embodiment, the connection objective to which the carbon nanotube is connected can be regarded as a Ti layer for carbidization (Ti layer before the heat treatment accompanying the growth of nanotubes (in the first embodiment) or Ti layer formed by the heat treatment before the growth of nanotube (in the second embodiment)), that is, a material of undergoing ohmic connection to the carbon nanotube by carbidization.

In the present invention, Nb, Si or C other than Ti can be used as the material (connection objective) undergoing an ohmic connection to carbon nanotube by carbidization. When the material as the connection objective is C (carbon), the carbon nanotube and the connection objective are connected by a carbon-carbon bond and, in the present invention, this connection by a carbon-carbon bond is also called herein connection by carbidization.

As the metal material acting as the catalyst for the growth of carbon nanotubes by CVD, Fe or Co can be used other than Ni. An alloy containing at least one metal selected from Ni, Fe and Co can also be used.

One of objects of a second aspect of the present invention is to provide a novel method capable of producing carbon nanotubes orientation-grown at a low temperature without relying on auxiliary means such as electric field (or plasma) which has been heretofore employed and, thereby, to enable the growth of carbon nanotubes on, for example, a semiconductor circuit which cannot be subjected to a high-temperature treatment.

In the method for growing carbon nanotubes of the present invention, a filament disposed in the growth chamber is used as a heat source for the growth of carbon nanotubes by CVD. Such a CVD process using a filament for heating (called a hot filament) is known as hot-filament CVD but in conventional techniques of using this method for the growth of carbon nanotubes, a filament temperature of 1,600° C. is required (see, *Chemical Physics Letters,* 342, pp. 259-264 (2001)).

The hot filament generates a heat upon passing of a current. The filament temperature at the growth of carbon nanotubes is preferably 400° C. or more. If the filament temperature is less than 400° C., this is insufficient to supply an energy for decomposing the starting material gas, whereas if it is unnecessarily elevated, the energy is wasted. Therefore, the filament temperature in general is preferably from 400 to 1,000° C., more preferably from 400 to 600° C., still more preferably from 400 to 500° C.

The hot-filament should be produced from a material capable of enduring high temperature (400° C. or more) at the growth of carbon nanotubes and at the same time, undergoing no or little chemical reaction with the starting material gas or a decomposition product thereof. The present inventors have found that for the purpose of producing carbon nanotubes by CVD from a starting material gas containing a carbon source, a filament made of rhenium or a material mainly comprising rhenium is suitable.

Figure 7:
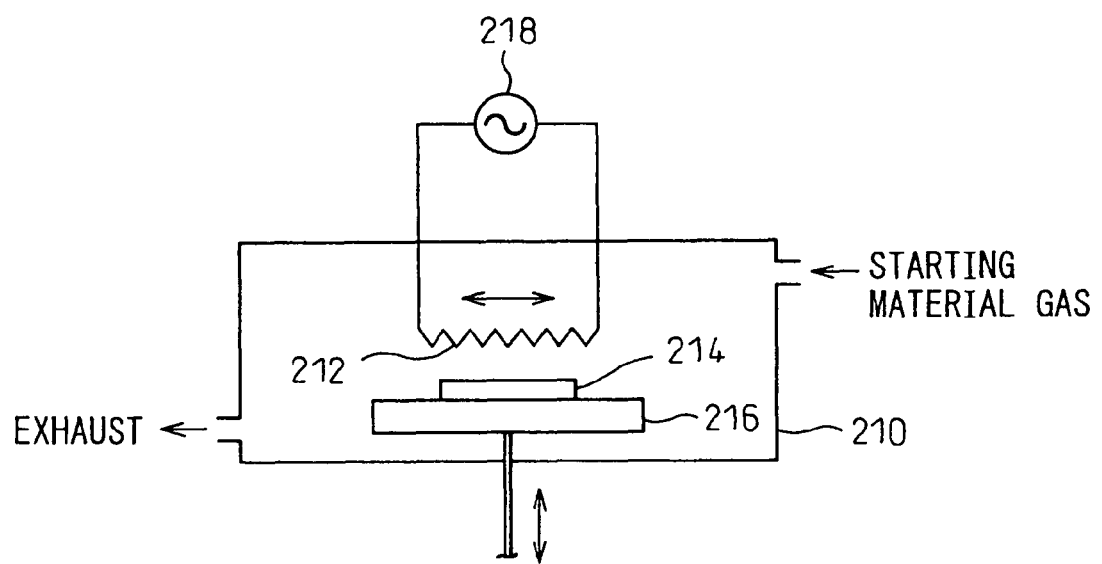
FIG. 7 is a schematic view for explaining the method for growing carbon nanotubes of the present invention.

As shown in FIG. 7, a hot-filament 212 is disposed to face a growth substrate 214 in a vacuum chamber (reaction chamber) 210 to which a starting material gas is supplied. The distance between the filament 212 and the substrate 214 is determined according to the carbon nanotube growth conditions (e.g., the kind of starting material gas used and the growth rate).

At the growth, the hot filament 212 can be moved above the substrate 214 to uniformly grow carbon nanotubes in an arbitrary area. Also, the substrate 214 may be moved by fixing the position of the hot filament 212. Alternatively, the hot filament 212 and the substrate 214 both may be relatively moved. As for the mode of movement, for example, rotation or reciprocation can be employed. For example, in FIG. 7, the filament 212 can be made to cause a reciprocating movement in the horizontal direction while moving the substrate 214 in the vertical direction by the movement of a substrate stage 216. The filament 212 is connected to, for example, an A.C. power source 218 and the substrate stage 216 is generally equipped with substrate heating means (not shown).

A carbon source gas containing carbon is used as the starting material for the growth of carbon nanotubes. The carbon source gas may be a hydrocarbon gas such as methane, ethane, acetylene, propane or butane, or a gas of alcohols such as methanol or ethanol. A mixture of two or more carbon sources may also be used.

The starting material gas may contain, in addition to the carbon source, one or both of a reactive gas such as hydrogen and an inert gas such as helium or argon.

The total pressure of the starting material gas in the growth chamber may be approximately from 0.1 to 100 kPa. If the pressure is less than 0.1 kPa, the growth rate of carbon nanotubes decreases, whereas if it exceeds 100 kPa, there may be a danger of the starting material gas leaking out of the growth chamber. The total pressure of the starting material gas is preferably from 0.1 to 10 kPa, more preferably from 0.3 to 10 kPa.

A substance acting as the catalyst for the growth reaction must be present on the substrate surface where carbon nanotubes are grown. As the catalyst, a transition metal such as Fe, Ni, Co or Pd may be used and an alloy of two or more of these transition metals may also be used. Furthermore, an alloy of such a transition metal capable of acting as the catalyst and a metal of not acting as the catalyst, for example, Fe—Pt and Co—Pt, may also be used.

The catalyst may form a thin film on the surface of the growth substrate or may be a fine particle dispersed on the substrate surface. In the case of a fine particle catalyst, the diameter of the growing carbon nanotube can be controlled by controlling the diameter of the fine particle. For example, as described in Examples later, when fine particle catalysts having diameters of about 7 nm and 4 nm were used, carbon nanotubes having diameters of about 15 nm and 8 nm could be obtained, respectively.

The thin-film catalyst may be formed by any method. For example, evaporation or sputtering can be used. The thickness of the thin film can be arbitrarily selected. On the other hand, the fine particle catalyst can be formed by utilizing laser ablation or a solution reaction. In the case of using a solution reaction, impurities such as carbon are sometimes attached to the periphery of the fine particle formed. The impurities are generally evaporated and disappear by heat treatment at a high temperature of 500° C. or more, however, in some cases, the impurities cannot be completely removed by this heat treatment only. In such a case, the remaining impurities can be removed by, for example, an annealing treatment using a reactive gas such as hydrogen. The annealing can be performed under conditions the same as or close to the temperature and pressure conditions at the growth. Therefore, this treatment can be performed in the growth chamber before the growth of carbon nanotubes is started, and, subsequently, the growth of carbon nanotubes can be performed in the same growth chamber.

In the present invention, a hot-filament is used, whereby the carbon nanotube can be orientation-grown at a relatively low temperature. According to the method of the present invention, a temperature of 600° C. or less of the growth surface of the substrate is sufficient for obtaining carbon nanotubes. The temperature of the growth surface of the substrate may even be less than 500° C.

As for the substrate on which carbon nanotubes are grown, for example, a substrate of a semiconductor represented by silicon can be used. As described above, the temperature of the substrate surface can be relatively low and therefore, a substrate material which cannot be used as the substrate for the growth of carbon nanotubes in conventional CVD methods, such as a glass substrate, can also be used.

In producing carbon nanotubes by the present invention, an apparatus where a growth substrate is contained and a starting material gas is supplied to orientation-grow carbon nanotubes on the substrate by CVD and where a hot filament is equipped in the growth chamber, is used.

EXAMPLES

The present invention is described in greater detail below by referring to Examples, however, the present invention is not limited thereto.

Example 1

In this Example, a case where the present invention is applied to an electronic device having a wiring via is described.

Figure 5A:
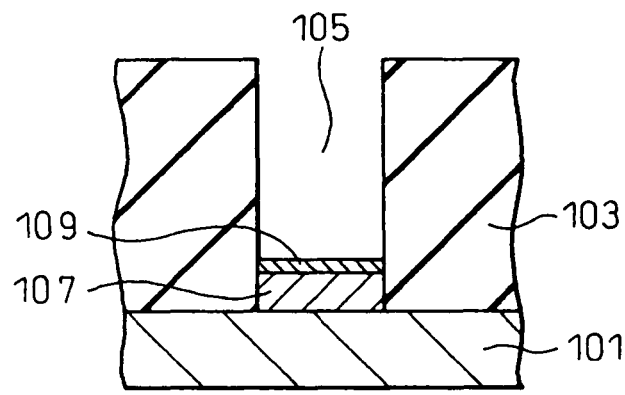
FIGS. 5A to 5C are schematic views showing the production process in Example 1.

As shown in FIG. 5A, an $SiO_2$ interlayer insulating film 103 (500 nm) is deposited on a lower wiring Cu layer 101 on a substrate (not shown) and thereon, a resist pattern (not shown) having openings, in the regions at which wiring vias are to be formed, is formed. By using the resist pattern as the mask, a wiring via 105 is formed in the interlayer insulating film 103. Thereafter, a Ti layer (50 nm) and an Ni catalyst metal layer (10 nm) are deposited in this order on the entire surface of the substrate by sputtering or evaporation. Subsequently, a Ti layer 107 (50 nm)/Ni layer 109 (10 nm) laminate film is caused to remain in the wiring via by the lift-off method using the resist film. In place of the Ni layer, a layer formed of Fe or Co may be used as the catalyst metal layer or a layer of an alloy containing at least one of Ni, Fe and Co may also be used. Also, in place of the thin layer of catalyst metal, a fine particle may be used. Furthermore, in place of the Ti layer, an Nb layer, an Si layer or a graphite carbon layer may be used.

Figure 5B:
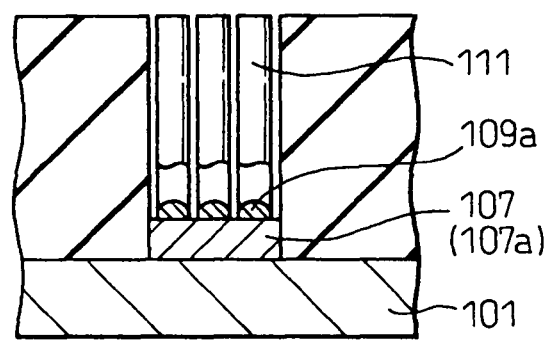

In the wiring via 105, carbon nanotubes 111 are grown by CVD (see, FIG. 5B). For the growth of carbon nanotubes, for example, thermal CVD is used. In this case, the substrate is placed in a vacuum chamber (reaction chamber) and, for example, a mixed gas of acetylene and hydrogen at flow rates of 80 sccm and 20 sccm, respectively, is introduced as a reaction gas into the vacuum chamber and the pressure and substrate temperature are set to 200 Pa and 900° C., respectively. Also, hot-filament CVD, for performing gas dissociation by a hot filament, may be used. In this case, for example, a mixed gas of acetylene and hydrogen at flow rates of 80 sccm and 20 sccm, respectively, is introduced as a reaction gas into the vacuum chamber and the pressure, substrate temperature and hot filament temperature are set to 1,000 Pa, 600° C. and 1,800° C., respectively. Alternatively, DC plasma enhanced hot-filament CVD, combining direct-current (DC) plasma and a hot filament, may also be used. In this case, for example, a mixed gas of acetylene and hydrogen, at flow rates of 80 sccm and 20 sccm, respectively, is introduced as a reaction gas into the vacuum chamber and the pressure, substrate temperature and hot filament temperature are set to 1,000 Pa, 600° C. and 1,800° C., respectively. In order to vertically orient the carbon nanotubes, a direct-current (DC) electric field of −400 V was applied to the substrate with respect to the chamber (grounded). The application of direct-current (DC) electric field is advantageous for obtaining perpendicularly oriented carbon nanotubes with respect to the substrate. The carbon nanotubes 111 are grown by taking the Ni fine particle 109a into the inside at the root from the Ni layer 109 and ohmically connected to the Ti layer 107 through TiC generated by the partial carbidization of Ti in the lower layer 107.

Before the growth of carbon nanotubes, the substrate in the vacuum chamber may be heat-treated (for example, at 600° C. for 30 minutes) in vacuum or in a hydrogen atmosphere to alloy the Ni/Ti laminate film. By this heat treatment, an Ni fine particle, a Ti layer and an NiTi alloy layer are formed in this order from the film surface. Thereafter, the carbon nanotube 111 is grown by CVD while incorporating the Ni fine particle in the uppermost part as the catalyst metal into the inside of the tube side wall and at the same time, the side wall of the nanotube is joined with the Ti layer 107a lying beneath.

Figure 5C:
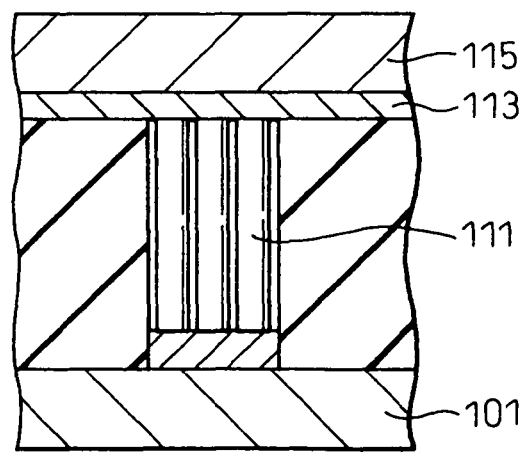

Then, as shown in FIG. 5C, a Ti layer 113 (50 nm) and a Cu layer 115 (500 nm) are deposited in this order by sputtering or evaporation. Subsequently, a heat treatment (for example, 500 to 800° C. for 30 minutes) is performed to cause TiC formation in the upper end of the carbon nanotube 111. As a result, the carbon nanotube 111 was connected by ohmic contact to the upper and lower wiring layers 101 and 115.

Example 2

In this Example, a case where the present invention is applied to an electronic device having a transverse wiring is described.

Figure 6A:
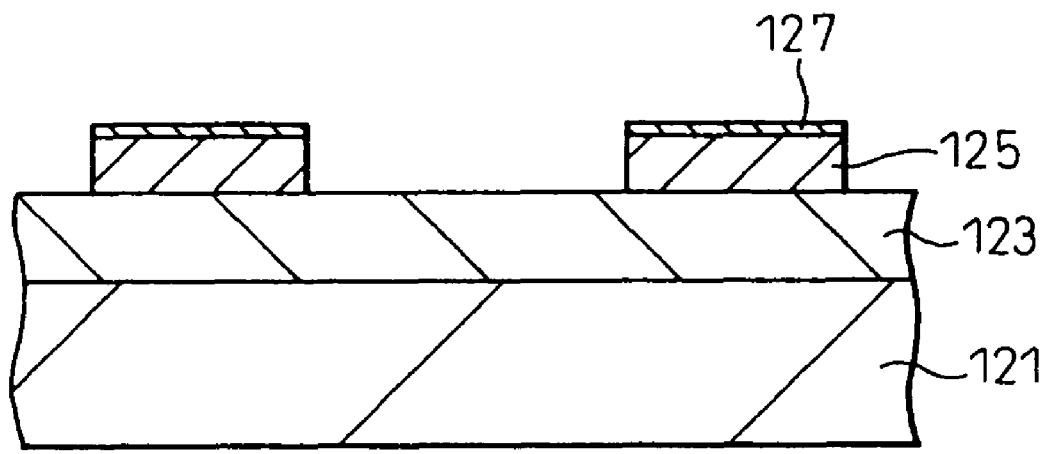
FIGS. 6A and 6B are schematic views showing the production process in Example 2.

As shown in FIG. 6A, an $SiO_2$ insulating film 123 (500 nm) is deposited on an Si substrate 121 and thereon, a resist pattern (not shown) having openings in the regions, at which electrodes are to be formed, is formed. On the entire surface of the substrate, a Ti layer (50 nm) and an Ni catalyst metal layer (10 nm) are deposited in this order by sputtering or evaporation. Subsequently, only a Ti layer 125 (50 nm)/Ni layer 127 (10 nm) laminate film (electrode pattern) in the openings of the resist pattern is caused to remain by the lift-off method using the resist film.

Figure 6B:
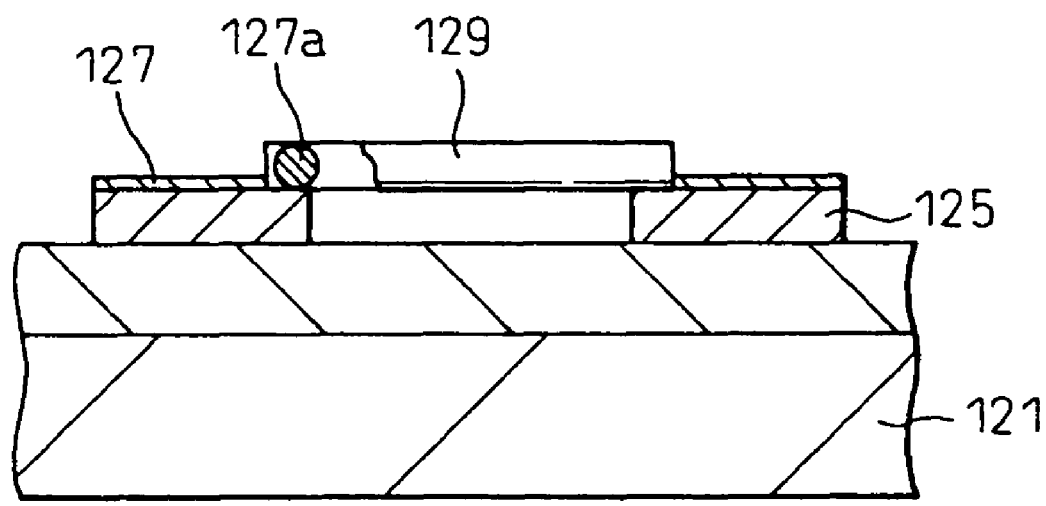

Between a pair of opposing electrode patterns, a carbon nanotube 129 is grown by CVD (see, FIG. 6B). The CVD and growth conditions used may be the same as those described in Example 1. Also, similarly to Example 1, the Ni/Ti laminate film may be heat-treated in advance of the growth of carbon nanotube by CVD. In order to transversely orient the carbon nanotube in parallel to the substrate surface, a direct-current (DC) electric field of 400 V was applied between electrodes. The carbon nanotube 129 is grown by incorporating a part of Ni in the Ni layer 127 as a catalyst element 127a into the inside and is ohmically connected to the Ti layer 125 through TiC generated by partial carbidization of Ti in the Ti layer 125.

Example 3

Figure 8A:
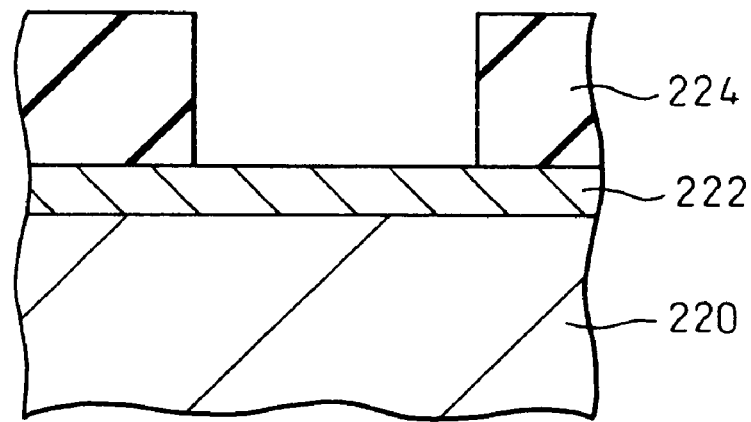
FIGS. 8A and 8B are views for explaining the growth of carbon nanotubes in Example 3.
Figure 8B:
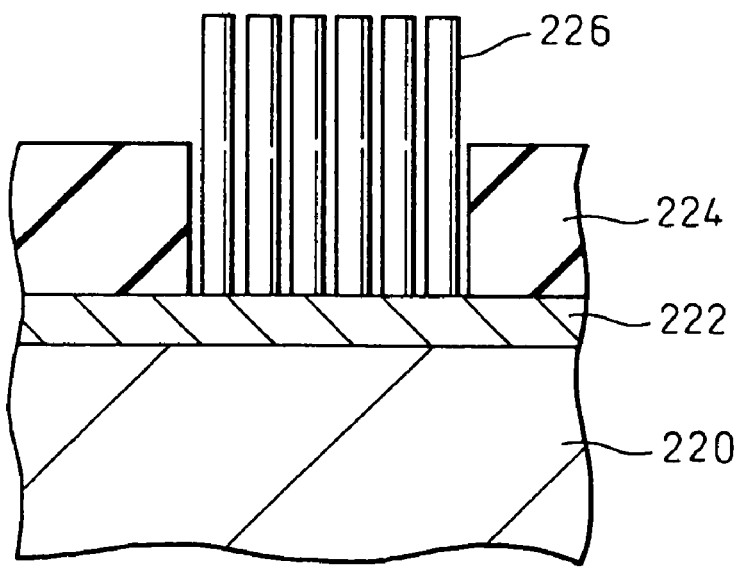

As shown in FIG. 8A, an Ni thin film 222 for catalyst was formed on a silicon substrate 220 by evaporation and, thereon, an SiN insulating film 224 (thickness: 500 nm) having an opening with a diameter of 2 μm was formed. The thickness of the Ni thin film 222 can be arbitrarily decided, but the thickness was set here to 2 nm. This substrate was introduced into a reaction part (vacuum chamber) (not shown) and the substrate temperature was set to 500° C. A starting material gas prepared by mixing argon and acetylene at a ratio of 80:20 was supplied to the reaction part at a flow rate of 100 ccm and the total gas pressure in the reaction part was adjusted to 1 kPa by the control in an exhaust system connected to a vacuum pump. A hot filament (made of rhenium) was moved above the substrate and with a distance of about 6 mm to the substrate, a current of about 8 A was passed. By this passing of a current, the hot filament temperature was elevated to 800° C. After maintaining this state for 1 minute, the passing of the current to the hot filament was stopped. The remaining starting material gas in the reaction part was vacuum-evacuated and the substrate was taken out from the reaction part. As shown in FIG. 8B, carbon nanotubes 226 having a length of about 2 μm were formed in the vertical direction from the substrate surface.

Example 4

Figure 9A:
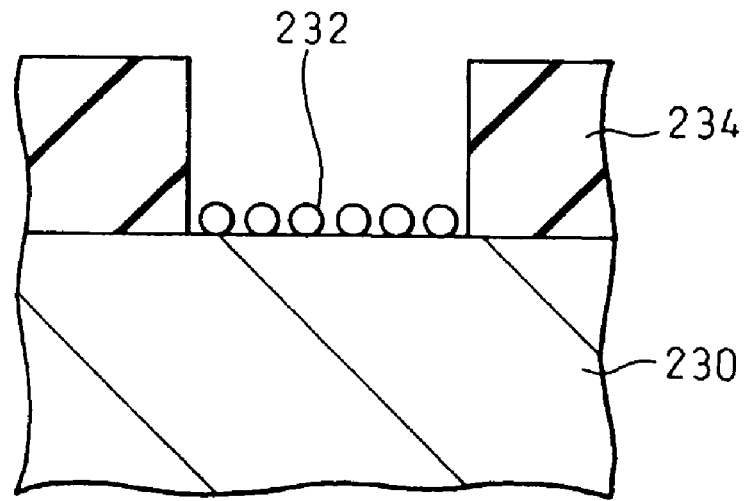
FIGS. 9A and 9B are views for explaining the growth of carbon nanotubes in Example 4.
Figure 9B:
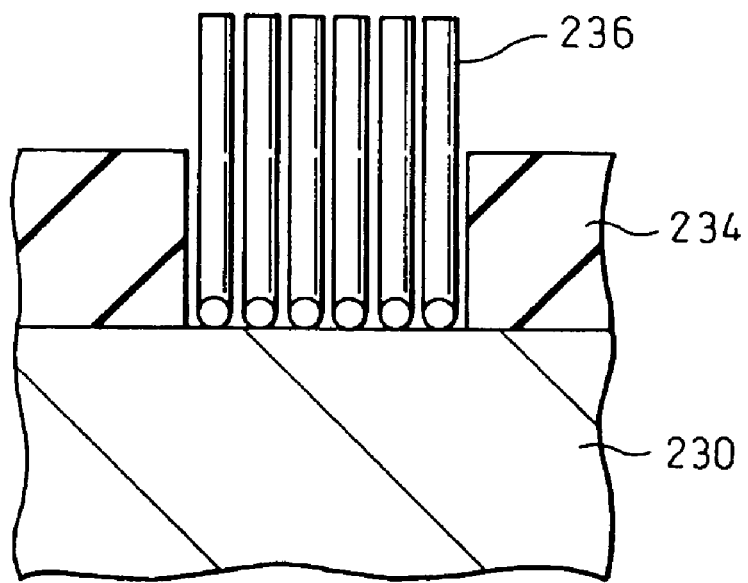

As shown in FIG. 9A, a film of Fe fine particles 232 having a diameter of 7 nm was formed by laser ablation in an opening with a diameter of 2 μm of an SiN insulating film 234 (thickness: 500 nm) formed on a silicon substrate 230. This substrate was introduced into a reaction part and the substrate temperature was set to 400° C. A starting material gas, prepared by mixing argon, acetylene and hydrogen at a ratio of 24:6:70, was supplied to the reaction part and the total pressure in the reaction part was adjusted to 1.3 kPa. A current of about 0.7 A was passed to a hot filament moved above the substrate and the hot filament temperature was set to about 400° C. After maintaining this state for 15 minutes, the passing of a current was stopped. The remaining starting material gas in the reaction part was vacuum-exhausted and the substrate was taken out from the reaction part. As shown in FIG. 9B, carbon nanotubes 236 having a length of about 2 μm and a diameter of about 15 nm were formed in the vertical direction from the substrate surface.

Example 5

Figure 10A:
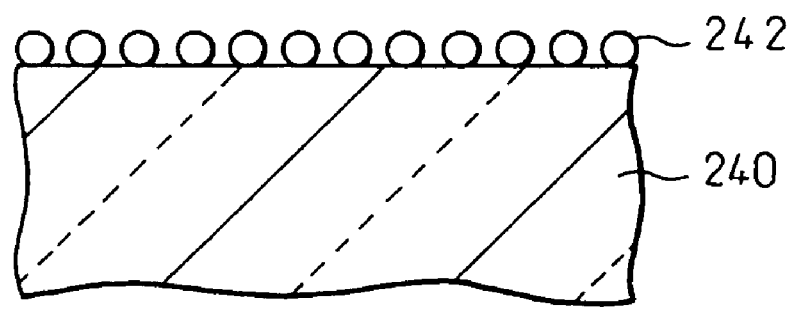
FIGS. 10A and 10B are views for explaining the growth of carbon nanotubes in Example 5.

As shown in FIG. 10A, a film of FePt fine particles 242 having a diameter of about 4 nm was formed on a glass substrate 240 by a solution reaction. Due to the solution reaction, the periphery of the FePt fine particle was covered with impurities such as carbon. Usually, most impurities are evaporated and disappear by a heat treatment of 500° C. or more, but this is not sufficient for using the FePt fine particle as the catalyst for the growth of carbon nanotubes. Therefore, after placing the substrate in a reaction part, hydrogen was introduced to adjust the pressure to 1 kPa and the substrate was annealed at 500° C., thereby completely cleaning the FePt fine particles.

Figure 10B:
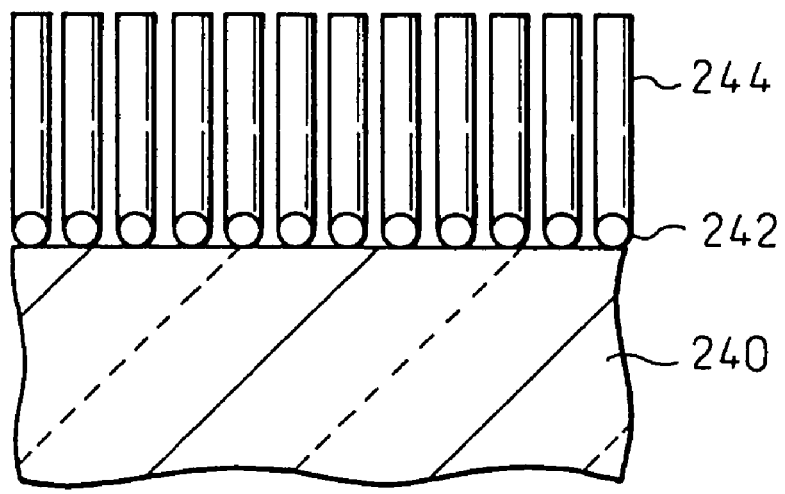

Thereafter, a 95:1:4 mixed gas of hydrogen, acetylene and argon was supplied to the reaction part and the total pressure in the reaction part was set to 1 kPa. A current of 10 A was passed through a hot filament moving above the substrate heated to 500° C. and this state was maintained for 10 minutes. As shown in FIG. 10B, carbon nanotubes 244 having a length of about 2 μm and a diameter of about 8 nm were formed in the vertical direction from the substrate surface.

As described, the present invention provides a structure where a carbon nanotube is connected by a good ohmic contact to a metal material (for example, electrode material or wiring material) which is the objective of connection. This ohmic connection structure is formed simultaneously with the growth of carbon nanotube and therefore, this can dispense with a step of forming an ohmic connection structure, which has been conventionally performed in the lower junction part of via of an electronic device after the growth of nanotubes. Accordingly, in the case of applying the carbon nanotube as a longitudinal wiring via material, particularly for ULSI wiring, a good ohmic connection, which has been heretofore difficult to produce, can be formed between the nanotube and the lower junction part.

Furthermore, according to the present invention, carbon nanotubes orientation-grown at a low temperature on a substrate can be obtained without relying on auxiliary means which has been heretofore used, such as electric field or plasma.

The invention claimed is:

1. A method for producing an electronic device having a structure of ohmic connection to a carbon element cylindrical structure body, comprising disposing a metal material on a connection objective capable of ohmically contacting a carbon element cylindrical structure body and forming a carbon element cylindrical structure body by chemical vapor deposition using said metal material as the catalyst while accomplishing an ohmic contact between the carbon element cylindrical structure body and the connection objective, wherein the material of said connection objective is Ti, Nb, Si or C, and is alloyed with said metal material by the elevation of temperature during said chemical vapor deposition and a carbon element cylindrical structure body is grown using the particle of said metal material in said alloy as the catalyst for said chemical vapor deposition, and, at the same time, a part of the material of the connection objective is carbidized to join the carbon element cylindrical structural body to the connection objective by ohmic contact.

2. The method for producing an electronic device as claimed in claim 1, wherein said metal material is Ni, Fe or Co, or an alloy containing at least one of Ni, Fe and Co.

3. The method for producing an electronic device as claimed in claim 1, wherein said chemical vapor deposition is performed by applying an electric field in the growth direction of the carbon element cylindrical structure body.

4. The method for producing an electronic device as claimed in claim 1, wherein said carbon element cylindrical structure body is a carbon nanotube.

5. A method for producing an electronic device having a structure of ohmic connection to a carbon element cylindrical structure body, comprising forming a first stack of a first material capable of ohmically contacting a carbon element cylindrical structure body and a second material of catalyst metal disposed on said first material, heat-treating said first stack in vacuum or in a hydrogen atmosphere to form a second stack made of a lower layer composed of an alloy of the first material and the second material, an intermediate layer composed of the first material and an upper layer composed of a fine particle of the second material, and forming a carbon element cylindrical structure body by chemical vapor deposition using the fine particle of the second material on the surface of said second stack as the catalyst to incorporate the fine particle of the second material into the inside of the carbon element cylindrical structure body and at the same time, a part of the first material in the intermediate layer contacting with the bottom of the side wall of the carbon element cylindrical structure is carbidized to join the carbon element cylindrical structure and the Ti intermediate layer by ohmic contact.

6. The method for producing an electronic device as claimed in claim 5, wherein said first material is Ti, Nb, Si or C.

7. The method for producing an electronic device as claimed in claim 5, wherein said second material is Ni, Fe or Co, or an alloy containing at least one of Ni, Fe and Co.

8. The method for producing an electronic device as claimed in claim 5, wherein said chemical vapor deposition is performed by applying an electric field in the growth direction of the carbon element cylindrical structure body.

9. The method for producing an electronic device as claimed in claim 5, wherein said carbon element cylindrical body is a carbon nanotube.

* * * * *